United States Patent
Wang et al.

(10) Patent No.: US 12,419,058 B2
(45) Date of Patent: Sep. 16, 2025

(54) SEMICONDUCTOR STRUCTURE, MANUFACTURING METHOD THEREFOR AND MEMORY

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Xiaoguang Wang, Hefei (CN); Dinggui Zeng, Hefei (CN); Huihui Li, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 593 days.

(21) Appl. No.: 17/857,219

(22) Filed: Jul. 5, 2022

(65) Prior Publication Data

US 2023/0061246 A1   Mar. 2, 2023

Related U.S. Application Data

(63) Continuation of application No. PCT/CN2022/077730, filed on Feb. 24, 2022.

(30) Foreign Application Priority Data

Sep. 1, 2021   (CN) .......................... 202111020954.5

(51) Int. Cl.
*H10B 61/00*     (2023.01)
*H10N 50/01*     (2023.01)

(52) U.S. Cl.
CPC ............. *H10B 61/22* (2023.02); *H10N 50/01* (2023.02)

(58) Field of Classification Search
CPC ........ H10B 61/22; H10N 50/01; H10N 50/10; H01L 27/228; H01L 43/02; H01L 43/08;
(Continued)

(56) References Cited

U.S. PATENT DOCUMENTS 7,781,285 B2    8/2010   Kim
8,542,519 B2    9/2013   Asao
(Continued)

FOREIGN PATENT DOCUMENTS

CN    102479541 A    5/2012
CN    109461756 A    3/2019
(Continued)

*Primary Examiner* — Fazli Erdem
(74) *Attorney, Agent, or Firm* — SYNCODA LLC; Feng Ma

(57) ABSTRACT

A semiconductor structure, a manufacturing method therefor and a memory are provided. The semiconductor structure may at least include: a plurality of aligned transistors, in which the transistors share a same source plate, channels of the transistors are located above the source plate, the channel length direction of the transistors is perpendicular to a surface of the source plate, and a material of the channels includes a single crystal semiconductor; a plurality of drain contacts, electrically connected with drains of the transistors, in which even number of the transistors share one same drain contact; and a plurality of magnetic tunnel junctions, located on the drain contacts and electrically connected with the drain contacts in one-to-one correspondence.

15 Claims, 12 Drawing Sheets

Sectional view A

(58) Field of Classification Search
CPC ............... H01L 43/12; H01L 29/42392; H01L 29/7869; H01L 29/78696
USPC ........................................................ 257/541
See application file for complete search history.

(56) References Cited

U.S. PATENT DOCUMENTS

| | | | |
|---|---|---|---|
| 8,830,735 | B2 | 9/2014 | Kariyada |
| 8,878,156 | B2 | 11/2014 | Satoh |
| 9,029,822 | B2 | 5/2015 | Satoh |
| 9,117,749 | B1 | 8/2015 | Or-Bach |
| 10,224,279 | B2 | 3/2019 | Or-Bach |
| 10,297,290 | B1 | 5/2019 | Beigel |
| 10,446,606 | B2 | 10/2019 | Kumar |
| 10,672,432 | B2 | 6/2020 | Beigel |
| 11,127,783 | B2 | 9/2021 | Zhu |
| 2007/0080385 | A1 | 4/2007 | Kim |
| 2010/0059837 | A1 | 3/2010 | Kim |
| 2010/0289084 | A1 | 11/2010 | Yoon |
| 2011/0215382 | A1 | 9/2011 | Asao |
| 2011/0266600 | A1* | 11/2011 | Kanaya ............. H01L 21/76897 257/295 |
| 2012/0135275 | A1 | 5/2012 | Kariyada |
| 2012/0306004 | A1 | 12/2012 | Yoon |
| 2014/0138609 | A1* | 5/2014 | Satoh ..................... H10B 61/22 257/5 |
| 2014/0346518 | A1 | 11/2014 | Kariyada et al. |
| 2015/0340316 | A1 | 11/2015 | Or-Bach et al. |
| 2016/0043136 | A1 | 2/2016 | Kim et al. |
| 2019/0027535 | A1 | 1/2019 | Kumar et al. |
| 2019/0157345 | A1 | 5/2019 | Zhu et al. |
| 2019/0206449 | A1 | 7/2019 | Beigel et al. |
| 2019/0259807 | A1 | 8/2019 | Kumar et al. |
| 2019/0348464 | A1* | 11/2019 | Sukekawa ............. H01F 10/329 |
| 2020/0144330 | A1* | 5/2020 | Majhi ................ H10D 30/6755 |
| 2020/0286528 | A1 | 9/2020 | Beigel et al. |
| 2021/0313391 | A1 | 10/2021 | Kumar et al. |
| 2021/0408118 | A1 | 12/2021 | Zhu et al. |
| 2022/0013151 | A1 | 1/2022 | Beigel et al. |

FOREIGN PATENT DOCUMENTS

| | | |
|---|---|---|
| CN | 110571261 A | 12/2019 |
| CN | 110892531 A | 3/2020 |
| CN | 111816673 A | 10/2020 |
| CN | 212136451 U | 12/2020 |
| CN | 212391999 U | 1/2021 |
| CN | 112349322 A | 2/2021 |
| EP | 3958319 A1 | 2/2022 |
| WO | 2017052542 A1 | 3/2017 |
| WO | 2018182724 A1 | 10/2018 |

* cited by examiner

Sectional view A

Sectional view B

SEMICONDUCTOR STRUCTURE, MANUFACTURING METHOD THEREFOR AND MEMORY

CROSS-REFERENCE TO RELATED APPLICATIONS

The application is a continuation application of International Application No.: PCT/CN2022/077730, filed on Feb. 24, 2022, which claims priority to Chinese Patent Application No. 202111020954.5, filed on Sep. 1, 2021. The disclosures of International Application No.: PCT/CN2022/077730 and Chinese Patent Application No. 202111020954.5 are hereby incorporated by reference in their entireties.

BACKGROUND

Semiconductor memory is used in most electronic devices to store data. Semiconductor memory includes dynamic random access memory (DRAM) and magnetic random access memory (MRAM). The data storage operation needs a certain driving current. However, with the miniaturization of semiconductor devices, the interconnection resistance of adjacent conductors increases with the decrease of contact area, and the driving current decreases under the same driving voltage, which leads to the inability to maintain the original driving ability. In addition, when the driving current is maintained at the original level by increasing the voltage supplied by the voltage source, the power consumption of the semiconductor device increases.

SUMMARY

Embodiments of the disclosure relate to, but are not limited to, a semiconductor structure, a method for manufacturing the semiconductor structure and a memory.

In one aspect, embodiments of the disclosure provide a semiconductor structure, which at least includes: a plurality of aligned transistors, in which the transistors share a same source plate, channels of the transistors are located above the source plate, a channel length direction of the transistors is perpendicular to a surface of the source plate, and a material of the channels includes a single crystal semiconductor; a plurality of drain contacts, electrically connected with drains of the transistors, in which even number of the transistors share one same drain contact; and a plurality of magnetic tunnel junctions, located on the drain contacts and electrically connected with the drain contacts in one-to-one correspondence.

According to some embodiments of the disclosure, another aspect of the embodiments of the disclosure also provides a memory, which at least includes the semiconductor structure described in any one of the above.

According to some embodiments of the disclosure, a further aspect of the embodiments of that disclosure also provides a manufacturing method of a semiconductor structure, including the following operations. A plurality of aligned transistors are provided, in which the transistors share a same source plate, channels of the transistors are located above the source plate, a channel length direction of the transistors is perpendicular to a surface of the source plate, and a material of the channels includes a single crystal semiconductor. A plurality of drain contacts are formed, and electrically connected with drain of the transistor, in which even number of the transistors share one same drain contact. A plurality of magnetic tunnel junctions are formed, which are located on the drain contacts, and electrically connected with the drain contacts in one-to-one correspondence.

BRIEF DESCRIPTION OF THE DRAWINGS

One or more embodiments are illustrated by the corresponding pictures in the drawings, which do not constitute a limitation on the embodiments. Unless otherwise stated, the figures in the drawings do not constitute a limitation of scale.

DETAILED DESCRIPTION

Embodiments of the disclosure will be described in detail below with reference to the accompanying drawings. However, one of ordinary skill in the art will understand that, numerous technical details have been set forth in various embodiments of the disclosure, in order to make the reader better understand the disclosure. However, even without these technical details and various changes and modifications based on the following embodiments, the technical solutions claimed in this disclosure can be realized.

FIGS. 1 to 6 are structural scheme diagrams of a semiconductor structure provided by an embodiment of the disclosure.

Figure 1:
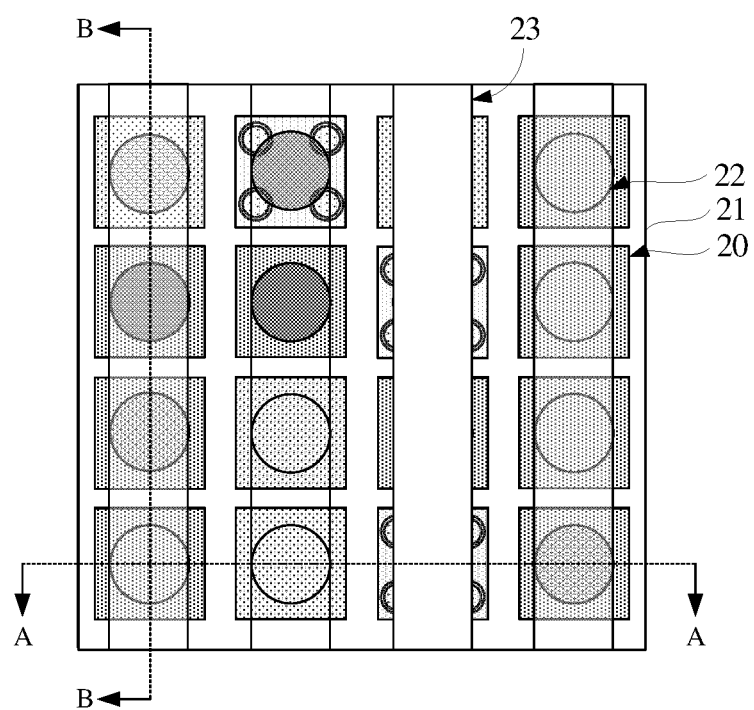
FIGS. 1 to 6 are structural scheme diagrams of a semiconductor structure provided by an embodiment of the disclosure.
Figure 2:
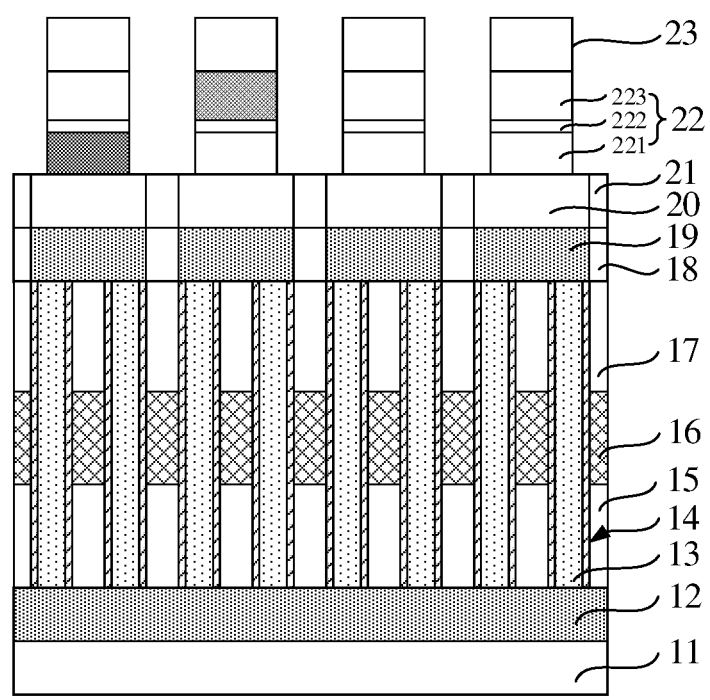
Figure 3:
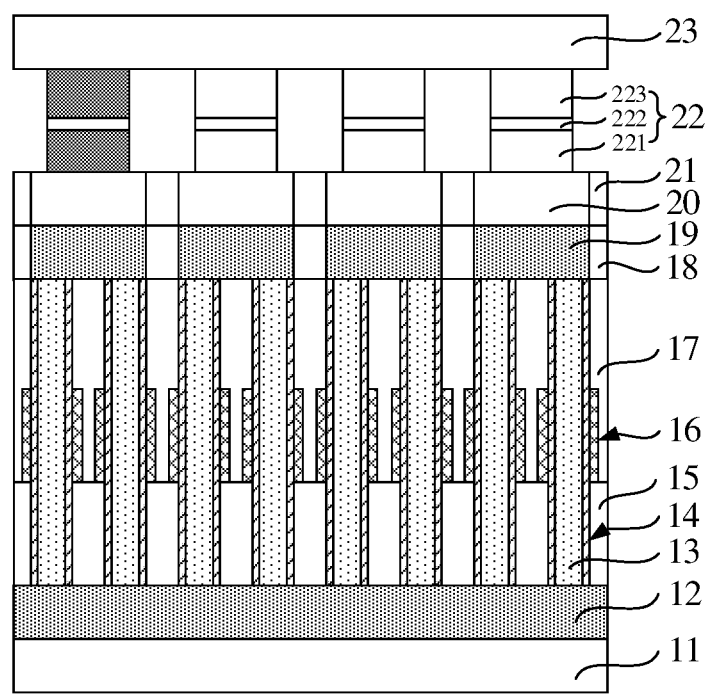

Referring to FIGS. 1 to 3, the semiconductor structure includes a plurality of aligned transistors, which share a same source plate 12, channels 13 of the transistors are located on the source plate 12, a direction along channel length of the transistors is perpendicular to a surface of the source plate 12, and a material of the channels 13 includes a single crystal semiconductor; a plurality of drain contacts 20 connected to drains 19 of the transistors, in which an even number of the transistors share one same drain contact 20; and a plurality of magnetic tunnel junctions 22, located on the drain contacts 20 and electrically connected to the drain contacts 20 in one-to-one correspondence.

The embodiment of the disclosure will be described in more details below with reference to the accompanying drawings.

The semiconductor structure includes a substrate 11 and a source plate 12 located on the substrate 11. The substrate 11 may be composed of an insulating material to function for isolation, and may also be a silicon wafer to facilitate growth of a single crystal material. The source plate 12 may be independent of the transistors, act as a source contact and provide source signals to the transistors, or act as sources of the transistors to receive source signals. In any case, a material of the source plate 12 is a conductive material, such as at least one of doped silicon, indium tin oxide (ITO), metal molybdenum, metal aluminum, metal titanium or metal copper.

In some embodiments, the channels 13 of the transistors are in direct contact with the source plate 12, and the channels 13 are integrated with the source plate 12, that is to say, the source plate 12 serves as sources of the transistors, and the plurality of the aligned transistors share the same source plate 12 and the same source signal, so that complexity of the process is reduced without using a mask and an etching process to prepare a plurality of discrete sources. The source plate 12 and the channels 13 can include the same single crystal semiconductor, so that the contact resistances between the source plate 12 and the channels 13 can be reduced, and each transistor can be guaranteed to have a larger driving current under a preset driving voltage. Meanwhile, the single crystal semiconductor includes single crystal silicon or single crystal germanium, and the source plate 12 includes doped single crystal silicon or doped single crystal germanium.

In some embodiments, the semiconductor structure includes a substrate 11, a source plate 12, a first isolation layer 15, word lines 16, and a second isolation layer 17 that are stacked in sequence. The first isolation layer 15 is disposed between the word lines 16 and the source plate 12 for isolating the source plate 12 from the word lines 16. The second isolation layer 17 is disposed between adjacent word lines 16 and covers top surfaces of the word lines 16, mainly for isolating word lines 16 from each other, as well as isolating the word lines 16 from other stacked film layers above the second isolation layer 17. Said other stacked film layers include but are not limited to the drain contacts 20.

It should be understood that a material of the first isolation layer 15 and a material of the second isolation layer 17 may be same or different. Meanwhile, the second isolation layer 17 may be composed of a first portion and a second portion. The first portion is disposed between adjacent word lines 16, and the second portion is disposed between the word lines 16 and the other stacked film layers. A material of the first portion and a material of the second portion may be same or different. For example, a dielectric constant of the material of the first portion is smaller than a dielectric constant of the material of the second portion. The first portion is mainly configured to suppress signal crosstalk of the adjacent word lines 16, and the second portion is configured to suppress signal crosstalk of the adjacent transistors and short circuit of film layers on opposite sides.

In addition, gate dielectric layers 14 and channels 13 pass through the second isolation layer 17, the word lines 16 and the first isolation layer 15 sequentially. Bottoms of the gate dielectric layers 14 and the channels 13 are in direct contact with the surface of the source plate 12. Each gate dielectric layer 14 covers entire sidewall surface of each channel 13. A length of the gate dielectric layers 14 and the channels 13 in the direction perpendicular to the surface of the source plate 12 is equal to the sum of the thicknesses of the first isolation layer 15, the word lines 16, and the second isolation layer 17. The length of the gate dielectric layers 14 is equal to the length of the channels 13. In other embodiments, a gate dielectric layer 14 is located only between a channel 13 and a word line 16, the gate dielectric layer 14 covers only part of the sidewall of the channel 13, and the length of the gate dielectric layer 14 is equal to the thickness of the word line 16 in a direction perpendicular to the surface of the source plate 12.

In some embodiments, a material of the gate dielectric layer 14 is a material with a high dielectric constant. For example, the material of the gate dielectric layer 14 includes at least one of $HfO_2$, $ZrO_2$ or HfON. The material of the gate dielectric layer 14 is provided with a high dielectric constant, which is conducive to suppressing the gate leakage current caused by electron tunneling in the case that the thickness of the gate dielectric layers 14 is thin.

Figure 4:
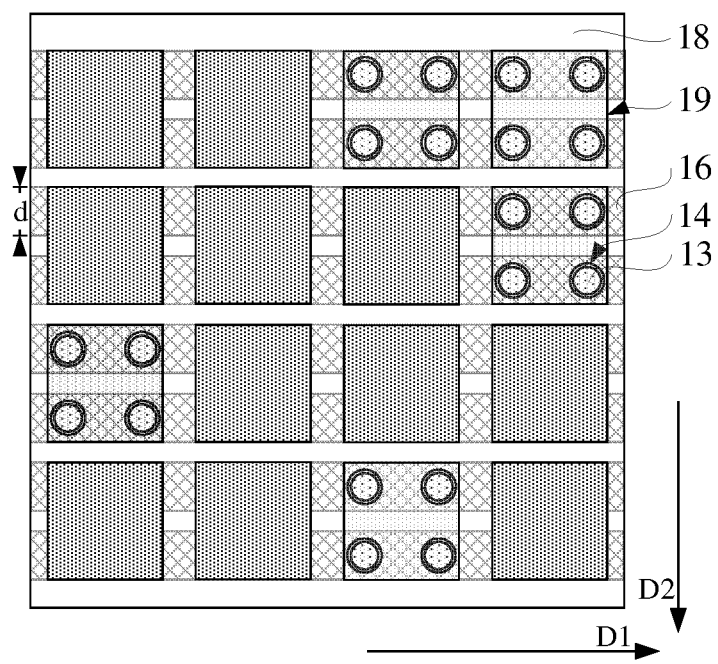

Referring to FIG. 4, the semiconductor structure includes a plurality of word lines 16 arranged in sequence, extending in a first direction D1 and arranged in a second direction D2 perpendicular to the first direction D1. Each word line 16 is configured to drive the transistors in its extending direction, and surrounds the channels 13. It can be understood that since the word line 16 surround the channels 13, a width d of each word line 16 is greater than an outer diameter of each gate dielectric layer 14 in the second direction D2.

In some embodiments, the transistors are arranged in an aligned array. The array of the transistors may be considered to be consisted of different rows extending in the first direction D1 and arranged in the second direction D2. Transistors of a row are aligned in the first direction D1, and adjacent rows are equally spaced in the second direction D2. The distances of adjacent transistors in the same row may be equal to the distances of adjacent rows in the second direction D2. Each word line 16 is configured to drive all the transistors in a same row in the array of the transistors.

In some embodiments, multiple transistors sharing one same drain contact 20 are located in at least two rows of the array of the transistors, and accordingly, the multiple transistors connected to the same drain contact 20 are driven by at least two word lines 16. Each of the drain contacts 20 has a regular pattern such as rectangle or square. A plurality of the drain contacts 20 are arranged in a regular array. The geometrical centers of the plurality of the drain contacts 20 in a same row are in a same straight line, so that when the center of the projection of a magnetic tunnel junction and the center of the projection of the corresponding drain contact coincide, the bit lines 23 can be effectively and uniformly contacted with each magnetic tunnel junction 22 in the extending direction thereof, thereby ensuring the signal transmission stability of the semiconductor structure. In other words, when the geometric centers of the plurality of the drain contacts 20 in the same row are in the same line, under the condition that the position of the bit line 23 is not changed and effective contact between the bit line 23 and the magnetic tunnel junctions 22 is ensured, the projection of the center of a magnetic tunnel junction 22 can coincide with the projection of the center of the corresponding drain contact 20, thereby ensuring that the drain contact 20 and the magnetic tunnel junction 22 have a good signal transmission performance.

Figure 5:
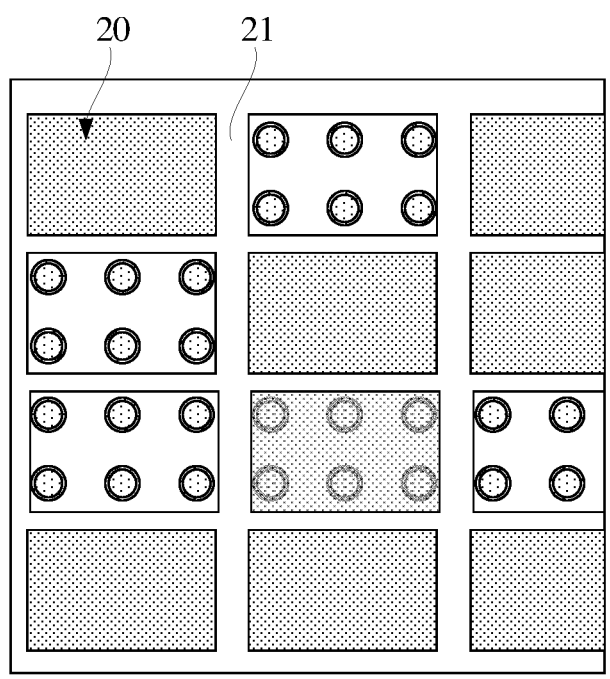
Figure 6:
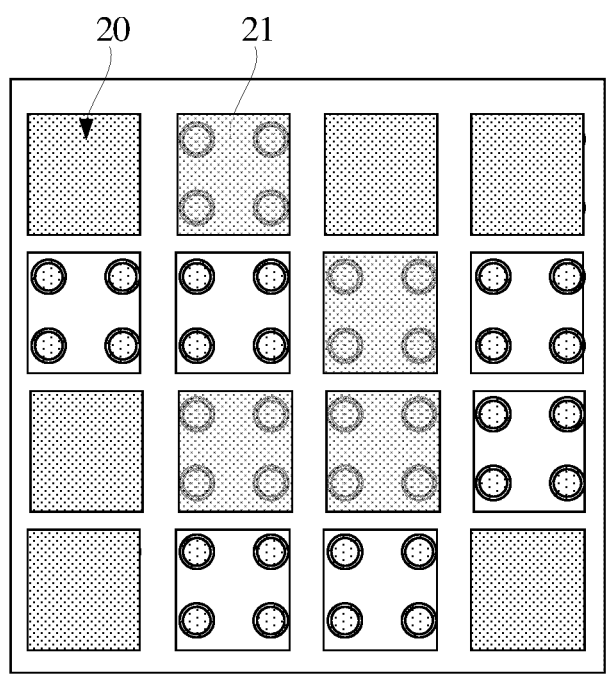

For example, referring to FIG. 5, 2M transistors share a same drain contact 20. The 2M transistors are located in two adjacent rows of the array of the transistors, each row has corresponding M transistors, and each drain contact 20 is rectangular, in which M is an integer greater than or equal to 2. For example, when M is equal to 3, 6 transistors share one same drain contact 20. Referring to FIG. 6, $N^2$ transistors share one same drain contact 20, the drain contact 20 is square, in which N is an integer greater than or equal to 2. For example, when N is equal to 2, four transistors share the same drain contact 20.

It should be understood that multiple transistors sharing a same drain contact 20 may also be located in a same row of the array of the transistors. In addition, based on the above description, KM transistors may share a same drain contact 20, and both K and M are parameters greater than or equal to 2. When K equals 2, as shown in FIG. 5, multiple transistors sharing the same drain contact 20 are located in two rows of the array of the transistors; when K equals 3, multiple transistors sharing the same drain contact 20 are located in three rows of the array of the transistors; and when K equals M, referring to FIG. 6, the drain contact 20 has a square shape.

In some embodiments, the drain 19 of each transistor is located between the channel 13 and the drain contact 20, and each transistor has a corresponding drain 19, that is, the drains 19 corresponding to different transistors are relatively independent. In other embodiments, the drains 19 have the same shape as the drain contacts 20, that is, even-number of the transistors share a same drain. In the direction perpendicular to the surface of the source plate 12, an orthographic projection of each drain contact 20 coincides with an orthographic projection of each drain 19. By setting the shape of each drain 19 to be the same as the shape of each drain contact 20, it is advantageous to increase the contact area between the drain 19 and the drain contact 20 and reduce the contact resistance between the drain 19 and the drain contact 20, thereby ensuring that the magnetic tunnel junction 22 can receive a larger driving current under a preset driving voltage.

In some embodiments, in the direction perpendicular to the surface of the source plate 12, each magnetic tunnel junction 22 includes a fixed layer 221, a tunnel junction 222, and a free layer 223 stacked in sequence. The fix layer 221 covers a surface of one drain contact 20. The fixed layer 221 and the free layer 223 are formed of a ferromagnetic material having in-plane magnetic anisotropy or having perpendicular magnetic anisotropy, and a magnetic orientation of the fixed layer 221 remains fixed. When magnetic orientations of the free layer 223 and the fixed layer 221 are adversely parallel (AP) to each other, a first state (for example, logic "1") is stored, and when the magnetic orientations of the free layer 223 and the fixed layer 221 are parallel (P) to each other, a second state (for example, logic "0") is stored. The relationship of the magnetic orientations of the free layer 223 and the fixed layer 221 can be judged by sensing a resistance when a current flows through the magnetic tunnel junction 22, thereby implementing data reading. Accordingly a transistor can be turned on by activating the corresponding word line 16, so as to generate a write current (i.e. the drive current described above) flowing through the magnetic tunnel junction 22 which adjusts the magnetic orientation of the free layer 223 to implement data storage.

In some embodiments, the semiconductor structure further includes a plurality of bit lines 23 arranged in sequence. The bit lines 23 are arranged in a direction perpendicular to the arrangement direction of the word lines 16. Each of the bit lines 23 connects all the magnetic tunnel junctions 22 in the extending direction of the bit line. The bit lines 23 are above the magnetic tunnel junctions 22. By arranging the bit lines 23 above the magnetic tunnel junctions 22, it is advantageous to avoid that the cross-sectional size of the bit lines 23 is limited by other structures on the same plane, and to ensure that the bit lines 23 have a wider size along its arrangement direction and a larger cross-sectional area along its extending direction, thereby ensuring that the bit lines 23 have lower transmission resistances and better signal transmission performances.

In the embodiment of the disclosure, the semiconductor structure adopts a single crystal semiconductor as the material of the channels of the transistors, as such, since the single crystal semiconductor has high carrier mobility, the transistor device prepared based on the single crystal semiconductor has high switching performance. In addition, when each drain contact is connected to an even number of transistors at the same time, the shape of the drain contact may be a regular rectangle, and the centers of a plurality of drain contacts in a same row is in the same straight line, so that the center projection of each magnetic tunnel junction and the center projection of the corresponding drain contact are coincided. Each bit line is effectively and uniformly contacted with each magnetic tunnel junction in the extending direction of the bit line, thereby ensuring the stable signal transmission performance of the semiconductor structure.

The embodiments of the disclosure also provide a memory, including any one of the above semiconductor structures. The memory prepared based on the above-mentioned semiconductor structure has lower requirements on driving voltage and less self-loss, which is conducive to reducing the heat generation during the operation of an electronic device, thereby reducing the cooling cost of the electronic device and improving the competitiveness of the electronic equipment.

FIGS. 7 to 12 show structural scheme diagrams corresponding to each operation of a manufacturing method of a semiconductor structure provided by an embodiment of the disclosure. Referring to FIGS. 7 to 12, the manufacturing method of the semiconductor structure provided by the embodiment of the disclosure includes the following operations.

Figure 7:
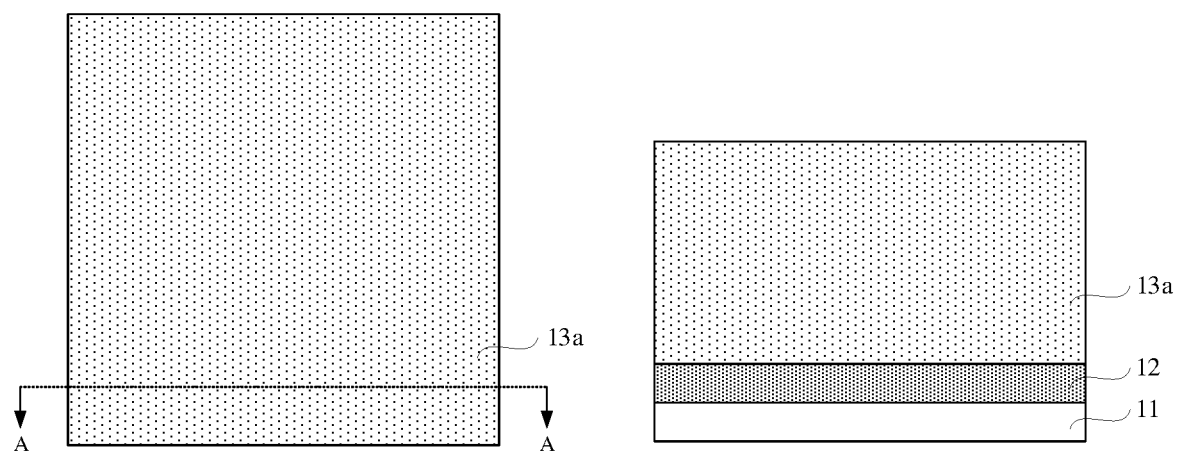
FIGS. 7 to 12 are structural scheme diagrams corresponding to each operation of a manufacturing method of a semiconductor structure provided by an embodiment of the disclosure.

Referring to FIG. 7, a substrate 11, a source plate 12 and an intrinsic layer 13a are provided stacked sequentially.

The substrate 11 may be either a supporting material for supporting formation of subsequent films, or a collection of all the formed films, only schematically shown as the substrate. When the substrate 11 only plays a supporting role, the substrate 11 may be removed after the target structure is formed, or the substrate 11 may not be formed. The substrate 11 may be a silicon wafer to facilitate growth of a single crystal material. The source plate 12 may serve as a source of transistors subsequently formed, or provide a source signal to the transistors subsequently formed. A material of the source plate 12 is a conductive material, such as at least one of doped silicon (single crystal silicon, polysilicon or microcrystalline silicon), indium tin oxide (ITO), metal molybdenum, metal aluminum, metal titanium or metal copper. A material of the intrinsic layer 13a includes a single crystal semiconductor and the intrinsic layer 13a is configured to prepare channels of the transistors.

Figure 8:
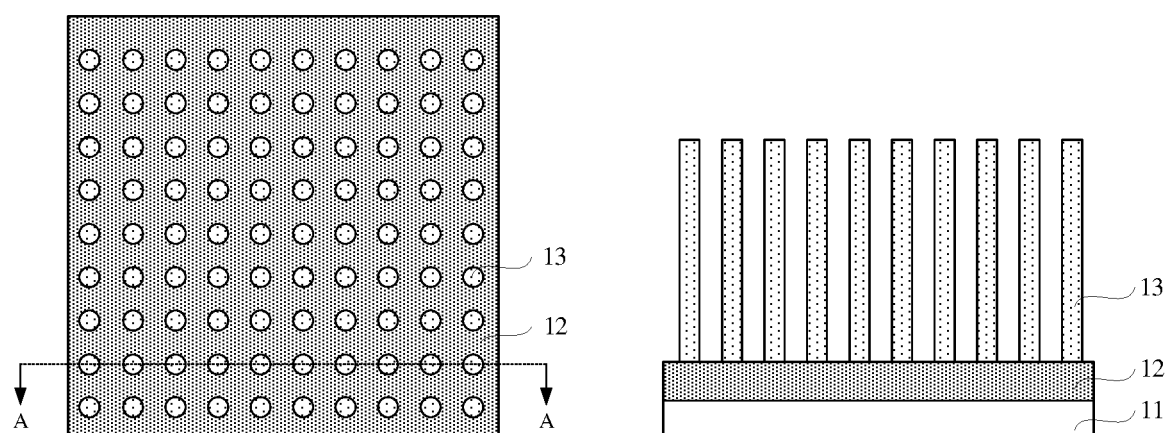

Referring to FIG. 8, the intrinsic layer 13a (refer to FIG. 7) is etched to form a plurality of aligned channels 13.

In some embodiments, the channels 13 of the transistors are in direct contact with the source plate 12, which serves as the sources of the transistors, and the plurality of aligned transistors share the same source plate 12 and share the same source signal. The source plate 12 and the channels 13 may include the same single crystal semiconductor to reduce contact resistance between the source plate 12 and the channels 13.

In some embodiments, the single crystal semiconductor includes single crystal germanium or single crystal silicon. It is conducive to improving the carrier transfer rate of a transistor device by using single crystal silicon or single crystal germanium as the material of the intrinsic layer 13a, and improving switching performance of the array of the transistors. In addition, the channels are formed first, and then an isolation layer located between adjacent transistors is formed, which is conducive to enlarging the diffusion space of deposited materials, so that a deposited gate dielectric layer can be more uniformly attached to the sidewall of each channel, so as to ensure that thicknesses of the gate dielectric layers in different transistors and thicknesses of different positions of a same transistor are similar, and ensure that the transistors have stable and reliable electrical properties.

Figure 9:
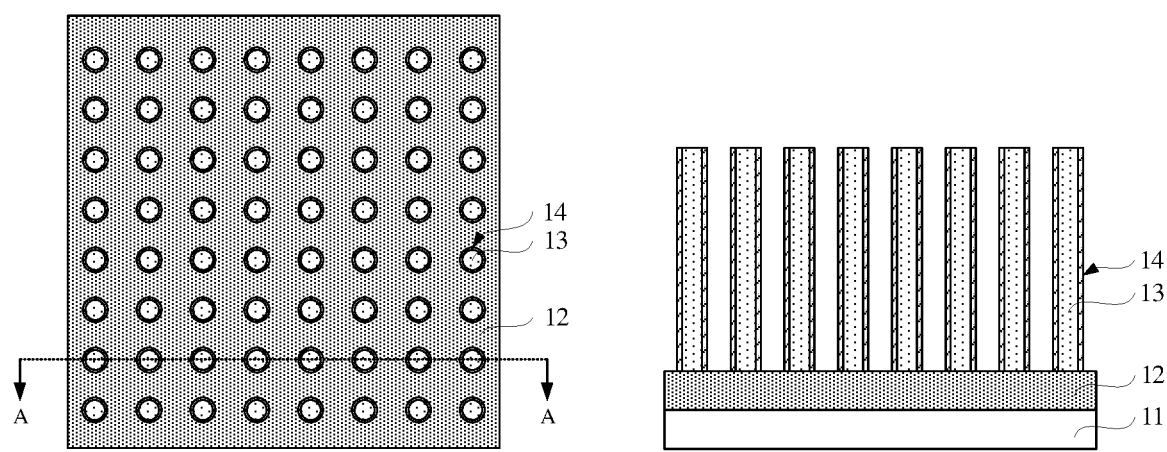

Referring to FIG. 9, a gate dielectric layer 14 is formed around the sidewall of each channel 13.

In some embodiments, a material of the gate dielectric layer 14 is a material with a high dielectric constant. For example, the material of the gate dielectric layer 14 includes $HfO_2$, $ZrO_2$ or HfON. It is conducive to suppressing gate leakage current caused by electron tunneling by using the material with a high dielectric constant as the gate dielectric layers 14, when the thickness of the gate dielectric layers 14 is thin.

Figure 10:
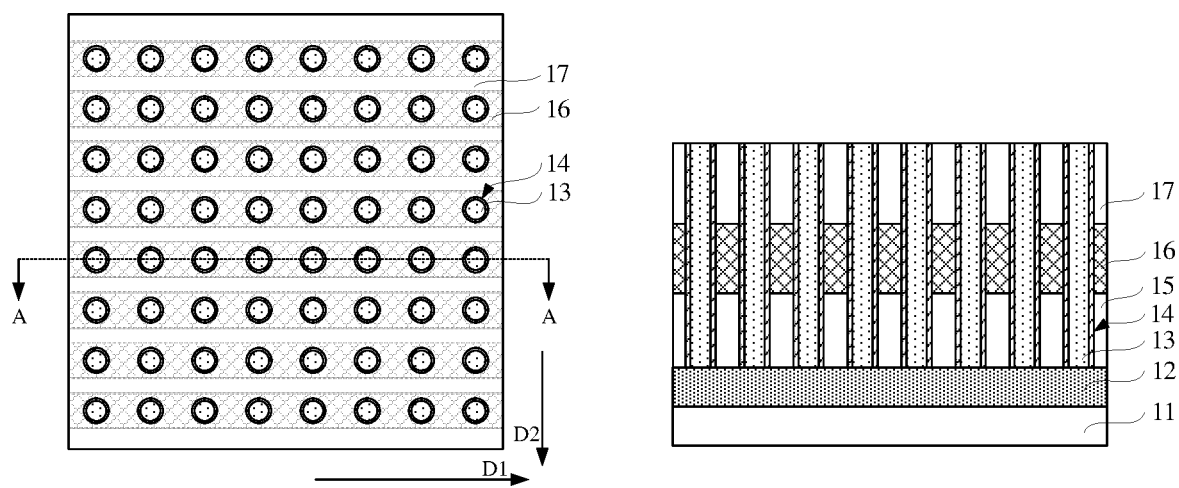

Referring to FIG. 10, a first isolation layer 15, a plurality of word lines 16 arranged in sequence and a second isolation layer 17 are formed.

A first isolation layer 15 located between the word lines 16 and the source plate 12 is configured to isolate the source plate 12 and the word lines 16, and to suppress signal crosstalk of adjacent transistors. The word lines 16 extend in the first direction D1 and are arranged along a second direction D2. Each word line 16 is configured to connect with and drive all the transistors located along the extending direction, in which the word line 16 surrounds the channels of the transistors to be driven, and the width of the word line 16 in the second direction D2 is greater than the outer diameter of the gate dielectric layers 14. A second isolation layer 17 is filled between the adjacent word lines 16 and covers on the word lines, top surfaces of the channels 13 are flush with a top surface of the second isolation layer 17, and part of an isolation material filled between the adjacent word lines 16 and part of an isolation material covering the top surfaces of the word lines 16 may be different.

Materials of the first isolation layer 15 and the second isolation layer 17 are both materials with low dielectric constants, including but not limited to silicon oxide, silicon nitride, silicon carbide or silicon oxynitride.

Figure 11:
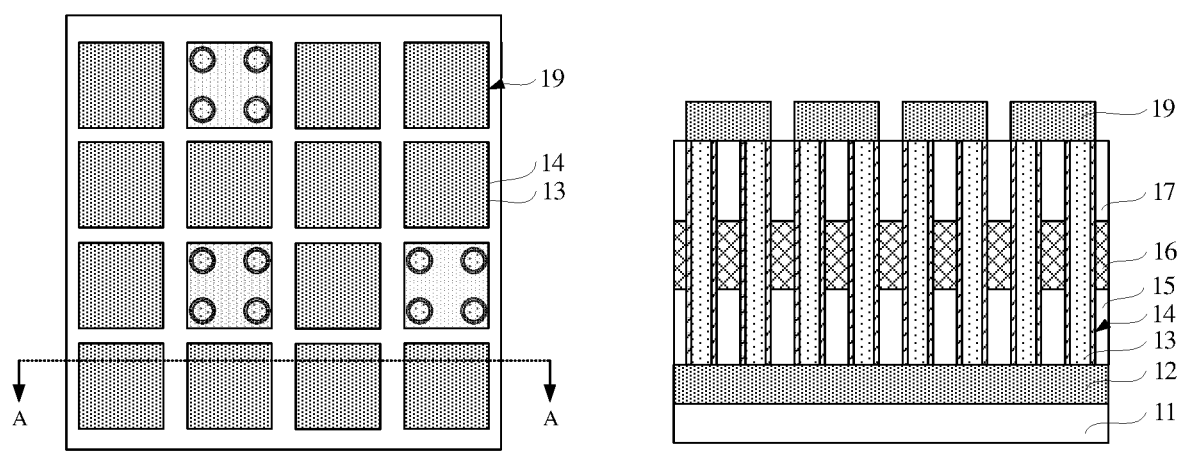

Referring to FIG. 11, a third isolation layer 18 and drains 19 are formed, in which a drain 19, a channel 13, the source plate 12, a gate dielectric layer 14 and part of a word line 16 constitute a transistor.

In some embodiments, even number of the channels 13 share a same drain 19, and the multiple transistors sharing the same drain 19 also share a same drain contact 20. In a direction perpendicular to the surface of the source plate 12, the drains 19 may have the same shape as the drain contacts 20 formed subsequently. In addition, the drains 19 and the channels 13 may contain the same single crystal semiconductor. For example, the channels 13 are of single crystal silicon and the drains 19 are of doped single crystal silicon. In other embodiments, each transistor corresponds to a drain 19, and the drains 19 corresponding to different transistors are independent of each other. Moreover, the material of the drains 19 may be the same as that of the source plate 12.

In some embodiments, the drains 19 and the channels 13 may contain the same single crystal semiconductor, and a third isolation layer 18 is formed before the drains 19 are formed. It can be understood that, since the drains 19 and the channels 13 contain the same material, an etchant for the drains 19 has a faster etching rate for the channels 13. In the case that a conductive layer is formed first and then etched to form the drains 19, the etching process may cause damage to the channels 13, especially when the drains 19 do not completely cover the top surfaces of the channels 13. Furthermore, the material of the third isolation layer 18 may be the same as the material of the first isolation layer 15 or the material of the second isolation layer 17.

Figure 12:
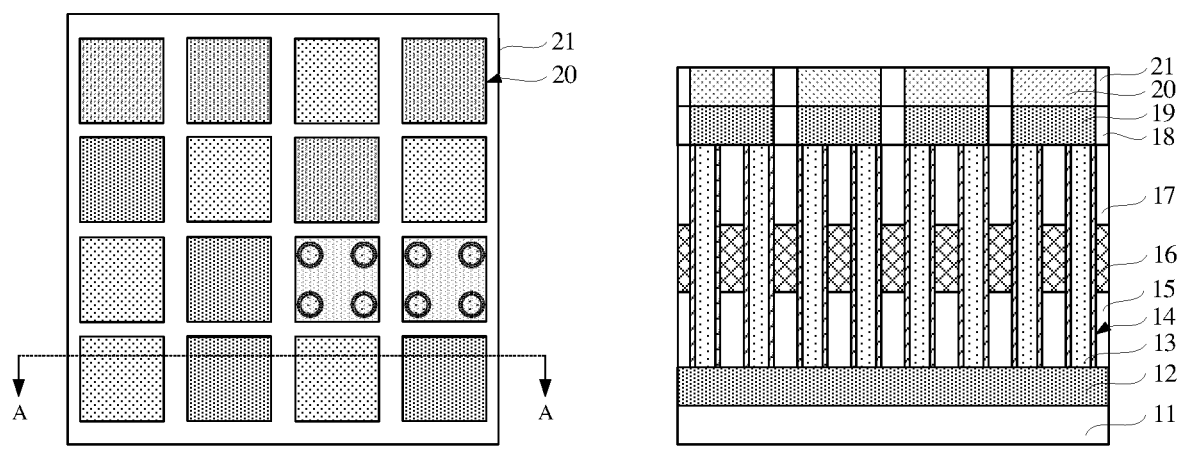

Referring to FIG. 12, drain contacts 20 and a fourth isolation layer 21 are formed.

In some embodiments, the drain contacts 20 have the same shape as the connected drains. Since contact resistance between the drains 19 and subsequently formed magnetic tunnel junctions 22 is larger than contact resistance between the drain contacts 20 and the magnetic tunnel junctions 22, it is conducive to reducing the contact resistances between different conductors by providing the drain contacts 20, thereby increasing driving current of the magnetic tunnel junctions 22 under a fixed driving voltage. In the case that the drains 19 of different transistors are relatively independent, providing the drain contacts 20 is also conducive to increasing contact area between the drains and the magnetic tunnel junctions, and supporting the magnetic tunnel junctions, so as to ensure that the magnetic tunnel junctions 22 of any size can be effectively connected with the corresponding transistors.

In some embodiments, the third isolation layer 18 and the fourth isolation layer 21 are two separate film layers, and a material of the fourth isolation layer 21 is the same as a material of the third isolation layer 18. In another embodiment, the drain contacts 20 are formed after the drains 19 are formed, and the isolation layers 18, 21 are formed after the drain contacts 20 are formed. The isolation layers 18, 21 are filled between the adjacent drains 19 and between the adjacent drain contacts, respectively, that is, the isolation layer 18 filled between the adjacent drains and the isolation layer 21 filled between the adjacent drain contacts are integrated.

Referring to FIGS. 1 to 3, the magnetic tunnel junctions 22 and bit lines 23 are formed.

The magnetic tunnel junctions 22 are located on the drain contacts 20, and the magnetic tunnel junctions 22 are electrically connected to the drain contacts 20 in one-to-one correspondence. The bit lines 23 are located above the magnetic tunnel junctions 22. The extending direction of the bit lines 23 is perpendicular to the extending direction of the word lines 16, and the arrangement direction of the bit lines 23 is perpendicular to the arrangement direction of the word lines 16. Each bit line 23 connects all the magnetic tunnel junctions 22 along its extending direction.

In the embodiment of the disclosure, the semiconductor structure adopts a single crystal semiconductor as the material of the channels of the transistors. Because the single crystal semiconductor has higher carrier mobility, a transistor device prepared based on the single crystal semiconductor has higher switching performance. In addition, when a drain contact is connected to even number of the transistors at the same time, the shape of the drain contact may be a regular rectangle, and the centers of a plurality of the drain contacts in a same row is in a same straight line, so that the center projection of each magnetic tunnel junction and the center projection of each corresponding drain contact are coincided, each bit line is effectively and uniformly contacted with each magnetic tunnel junctions in the extending direction of the bit line, thereby ensuring the stable signal transmission performance of the semiconductor structure.

Those of ordinary skill in the art will understand that, the above-described embodiments are intended to achieve specific embodiments of the disclosure, while in practical application, various changes in forms and details may be made thereto without departing from the spirit and scope of the disclosure. Any person skilled in the art may make their own changes and modifications without departing from the spirit and scope of the disclosure, so the scope of protection of the disclosure shall be subject to the scope defined by the claims.

INDUSTRIAL PRACTICALITY

In the embodiments of the disclosure, the semiconductor structure may at least include: a plurality of aligned transistors, in which the transistors share a same source plate, channels of the transistors are located above the source plate, a channel length direction of the transistors is perpendicular to a surface of the source plate, and a material of the channels includes a single crystal semiconductor; a plurality of drain contacts, electrically connected with the drains of the transistors, in which even number of the transistors share one same drain contact; and a plurality of magnetic tunnel junctions, located on the drain contacts and electrically connected with the drain contacts in one-to-one correspondence. The embodiments of the disclosure are conducive to improving the electrical properties of semiconductor structures.

The invention claimed is:

1. A semiconductor structure, comprising:
a plurality of aligned transistors, wherein the transistors share a same source plate, channels of the transistors are located above the source plate, a channel length direction of the transistors is perpendicular to a surface of the source plate, and a material of the channels comprises a single crystal semiconductor;
a plurality of drain contacts with a regular rectangle, electrically connected with drains of the transistors, wherein even number of the transistors share one same drain contact; and
a plurality of magnetic tunnel junctions, located on the drain contacts and electrically connected with the drain contacts in one-to-one correspondence; and a center projection of each magnetic tunnel junction coincides with a center projection of each corresponding drain contact onto the surface of the source plate.

2. The semiconductor structure according to claim 1, wherein the channels of the transistors are in direct contact with the source plate, and the channels are integrated with the source plate.

3. The semiconductor structure according to claim 1, wherein the source plate comprises the single crystal semiconductor.

4. The semiconductor structure according to claim 3, wherein the single crystal semiconductor comprises single crystal silicon or single crystal germanium.

5. The semiconductor structure according to claim 1, further comprising: a plurality of word lines arranged in sequence above the source plate, wherein each of the word lines is configured to drive the transistors in an extending direction of the word line, and surrounds the channels.

6. The semiconductor structure according to claim 5, wherein the plurality of the transistors connected to the same drain contact are driven by at least two of the word lines.

7. The semiconductor structure according to claim 5, further comprising: a plurality of bit lines arranged in sequence, wherein an arrangement direction of the bit lines is perpendicular to an arrangement direction of the word lines, and each of the bit lines connects all of the magnetic tunnel junctions in an extending direction of the bit line, and is located on the magnetic tunnel junctions.

8. The semiconductor structure according to claim 5, further comprising: gate dielectric layers, which are respectively located between channels and word lines and respectively surround the channels, wherein a material of the gate dielectric layers comprises at least one of $HfO_2$, $ZrO_2$ or HfON.

9. The semiconductor structure according to claim 8, wherein in the direction perpendicular to the surface of the source plate, a length of the gate dielectric layers is equal to a length of the channels, or the length of the gate dielectric layers is equal to a thickness of the word lines.

10. The semiconductor structure according to claim 1, wherein the drain contacts are square or rectangular.

11. The semiconductor structure according to claim 10, wherein N2 transistors share one same drain contact, and the drain contact is square, wherein N is an integer greater than or equal to 2.

12. The semiconductor structure of claim 10, wherein 2M transistors share one same drain contact, and the drain contact is rectangular, wherein M is an integer greater than or equal to 2.

13. A memory, comprising the semiconductor structure according to claim 1.

14. A manufacturing method of a semiconductor structure, comprising:
providing a plurality of aligned transistors, wherein the transistors share a same source plate, channels of the transistors are located above the source plate, a channel length direction of the transistors is perpendicular to a surface of the source plate, and a material of the channels includes a single crystal semiconductor;
forming a plurality of drain contacts with a regular rectangle electrically connected with drains of the transistors, wherein even number of the transistors share one same drain contact; and
forming a plurality of magnetic tunnel junctions located on the drain contacts, and are electrically connected with the drain contacts in one-to-one correspondence; and a center projection of each magnetic tunnel junction coincides with a center projection of each corresponding drain contact onto the surface of the source plate.

15. The manufacturing method of a semiconductor structure according to claim 14, wherein forming the transistors comprises:
forming the source plate and an intrinsic layer which are stacked;
etching the intrinsic layer to form a plurality of the channels that are aligned arranged;
forming gate dielectric layers respectively surrounding the sidewalls of the channels; and
forming a first isolation layer and a plurality of word lines arranged in sequence, wherein the first isolation layer is located between the word lines and the source plate, and the word lines respectively surround the gate dielectric layers in an extending direction of the word line.

* * * * *